United States Patent [19]

Rigg et al.

[11] Patent Number: 5,173,776
[45] Date of Patent: Dec. 22, 1992

[54] APPARATUS AND METHOD FOR IMPROVING THE SIGNAL-TO-NOISE RATIO OF VIDEO DISPLAY SIGNALS

[75] Inventors: Philip R. Rigg, Saratoga, Calif.; Neil Baumgarten, Weston, Mass.

[73] Assignee: ElectroScan Corporation, Wilmington, Mass.

[21] Appl. No.: 534,698

[22] Filed: Jun. 6, 1990

[51] Int. Cl.⁵ .......................................... H04N 5/217
[52] U.S. Cl. ..................... 358/167; 358/166
[58] Field of Search ............... 358/167, 166, 36, 37

[56] References Cited

U.S. PATENT DOCUMENTS

| | | | |
|---|---|---|---|
| 3,055,920 | 10/1991 | Illetschko et al. | 358/167 |
| 3,940,763 | 2/1976 | Paradise | 342/399 |
| 4,240,106 | 12/1980 | Michael et al. | 358/36 |
| 4,246,610 | 1/1981 | Takahashi | 358/167 |
| 4,494,140 | 1/1985 | Michael | 358/167 |
| 4,584,599 | 4/1986 | Mobley, II | 358/167 |
| 4,646,138 | 2/1987 | Willis | 358/167 |
| 4,679,086 | 7/1987 | May | 358/167 |
| 4,747,157 | 5/1988 | Kurakake | 358/37 |
| 4,792,854 | 12/1988 | Glenn | 358/167 |

Primary Examiner—James J. Groody
Assistant Examiner—Jeffrey S. Murrell
Attorney, Agent, or Firm—Curtis Morris & Safford

[57] ABSTRACT

An apparatus and method for continuously improving the signal-to-noise ratio of a stationary video image by digital integration, without the loss of signal amplitude incurred by conventional designs. The apparatus includes a sampling analog-to-digital converter for digitizing an input video signal frame which is supplied to a calculating device along with a preceding video signal frame supplied from the output of the calculating device through a memory device. These features, in conjunction with other digital logic components, form a digital recusive filter. The calculating device sums new and previously stored data for each pixel in amounts scaled to counteract the loss of signal range that occurs as the random-noise component averages to zero. By appropriate selection of operating parameters, the method can be used to maintain or even boost the amplitude of a video signal while simultaneously enhancing its signal-to-noise ratio.

6 Claims, 7 Drawing Sheets

APPARATUS AND METHOD FOR IMPROVING THE SIGNAL-TO-NOISE RATIO OF VIDEO DISPLAY SIGNALS

BACKGROUND OF THE INVENTION

1. Field of the Invention

This invention relates to apparatus and method for collecting and time-averaging visual information carried within "noisy" video signals, and more particularly, relates to apparatus and method for collecting and time-averaging visual information carried within "noisy" video signals which are generated by scanned particle-beam instruments such as the scanning electron microscope ("SEM"). The invention is generally applicable to any problem of recovering a spatially stationary image signal buried within large amounts of superimposed random noise, such as that often found in low-current or low-light level imaging detectors.

2. Description of the Prior Art

Figure 1:
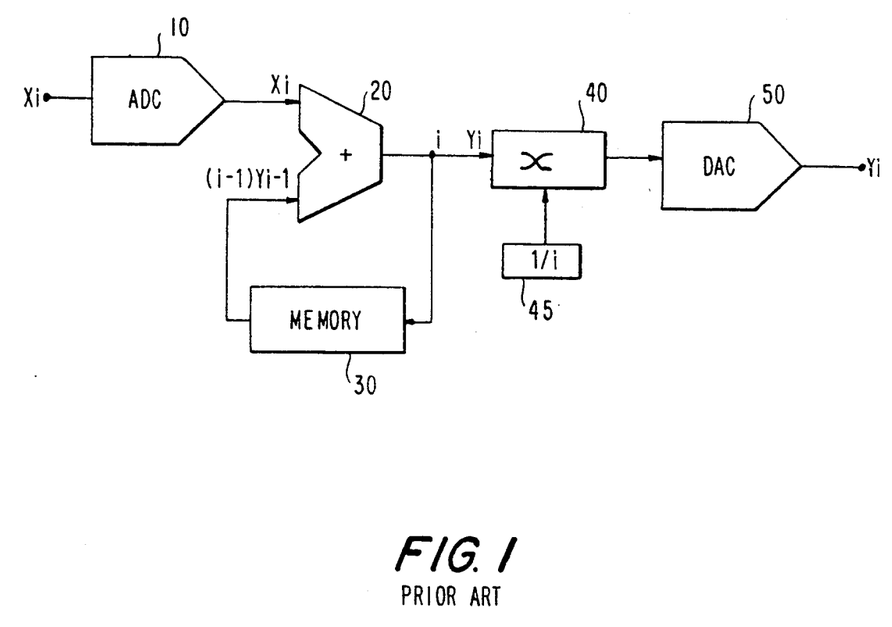
FIG. 1 is a block diagram illustrating a temporal filter device according to the prior art.

Signal-to-noise ratio enhancement of SEM images is typically performed (usually in conjunction with scan rate conversion) by an electronic system such as that shown in block form in FIG. 1. The incoming (noisy) video signal is periodically sampled and converted to a series of digital intensity values, which are stored sequentially in a memory array, individually addressed by the co-ordinate of their position in the image. With each new video frame cycle, the stored values are fed back to computational circuitry which performs a "running average" on a pixel by pixel basis, summing new data collected at a given pixel with data previously stored for that pixel. The old and new data is mixed in predetermined proportions, then renormalized (to avoid overflow) and stored back in the same memory location.

The image being processed may be viewed concurrently by feeding the current pixel data in sequence to the output DAC at the desired display frequency. As successive frames are collected and processed the stationary image tends to improve as the random noise component averages out to zero. By varying the proportions of new and stored data, it is possible to control the rate of signal-to-noise ratio improvement according to the incoming signal quality.

This process is a type of digital signal processing variously known as temporal filtering, digital integration, or frame averaging. A special case of the temporal filter is the progressive-ratio or Kalman filter, in which the "mixing ratio" is a linear function of frame count. The Kalman filter (or a near approximation to it) is widely used for SEM imaging as it collects the maximal amount of information per unit time while maintaining an algebraically normalized output at all times.

As the signal-to-noise ratio of the input increases, however, the Kalman filter suffers (as do all fixed-ratio filters) from a "shrinkage" of the output amplitude as the noise component is averaged out. Increasing the input amplitude cannot compensate for this as the input dynamic range is limited by the analog-to-digital converter.

OBJECTS AND SUMMARY OF THE INVENTION

An object of the present invention is to provide a method and apparatus for continuously improving the signal-to-noise ratio of a stationary video image by digital integration which overcomes the foregoing problems associated with the prior art.

It is another object of the present invention to provide a method and apparatus for continuously improving the signal-to-noise ratio of a stationary video image by digital integration wherein as the signal-to-noise ratio of the input increases, the output amplitude does not "shrink" as the noise component is averaged out.

An additional object of the present invention is to provide an apparatus and method for continuously improving the signal-to-noise ratio of a stationary video image by digital integration which maintains or even boosts the amplitude of a video signal while simultaneously enhancing its signal-to-noise ratio.

In accordance with an embodiment of this invention, an apparatus and method for continuously improving the signal-to-noise ratio of a stationary video image by digital integration is provided. The apparatus and method include an input device for receiving frames of video display signals; a calculating device coupled to said input device for producing a sum signal representing the sum of a present frame of video display signals and an output video display signal of a preceding frame; a generating device for generating a gain factor signal; a determining device for determining a normalization factor signal of the sum signal and a multiplying device coupled to the calculating device, the generating device and the determining device for multiplying the sum signal, the gain factor signal and the normalization signal producing an output video display signal which maintains or even boosts the amplitude thereof while simultaneously enhancing its signal-to-noise ratio.

With this temporal filter, based on an analytical model of the radom-noise component, a set of filter coefficients are calculated which determine the "mixing ratio" on a frame by frame basis. The coefficients boost the operands beyond the proportions required for algebraic normalization, such that the result and output is "super-normalized" by the exact gain factor needed to offset the amplitude loss as a function of input signal-to-noise ratio, the image memory bit depth, and the desired run time of the filter.

DETAILED DESCRIPTION OF THE PREFERRED EMBODIMENTS

In order that the problems overcome by the present invention may be fully understood, an apparatus for improving the signal-to-noise ratio of video signals using a temporal filter according to the prior art will be initially described with reference to FIG. 1.

The apparatus shown in FIG. 1 includes an analog-to-digital converter (ADC) 10, a calculating device 20, a memory device 30, a multiplying device 40, a determining device 45 and a digital-to-analog device 50. In FIG. 1, input video signal frames are supplied through an input terminal $x_i$ to the analog-to-digital converter (ADC) 10. The digitized output signal from ADC 10 is coupled to the calculating device 20 which is adapted to add a present video signal frame, supplied from ADC 10, to a preceding video signal frame obtained from the output of calculating device 20 through a memory device 30. The output summed signal from calculating device 20 and a signal representing a normalization factor from a determining device 45 are coupled to a multiplying device 40. Multiplying device 40 is adapted to multiply the normalization factor, (1/i) which is the inverse of the video frame count (i), by the summed video signal, thereby forming an output video signal with improved signal-to-noise ratio which is then converted to analog form in a digital-to-analog converter 50 and subsequently supplied to an output terminal.

The mathematical formula for the temporal Kalman filter illustrated in FIG. 1 is given by:

$$y_i = (1/i)x_i + [(i-1)/i]y_{i-1} \quad (1)$$

where, i is the frame count, $y_i$ is the current output signal from the filter, $x_i$ is the current input signal and $y_{i-1}$ is the previous output signal of the filter. Expanding the above equation as a function of frame count produces:

$$y_1 = x_1$$

$$y_2 = (\tfrac{1}{2})x_2 + (\tfrac{1}{2})y_1 = (x_1 + x_2)/2$$

$$y_3 = (\tfrac{1}{3})x_3 + (\tfrac{2}{3})y_2 = (x_1 + x_2 + x_3)/3$$

$$y_i = (1/i)x_i + ((i-1)/i)y_{i-1} = (x_1 + x_2 + \ldots + x_i)/i$$

Figure 2:
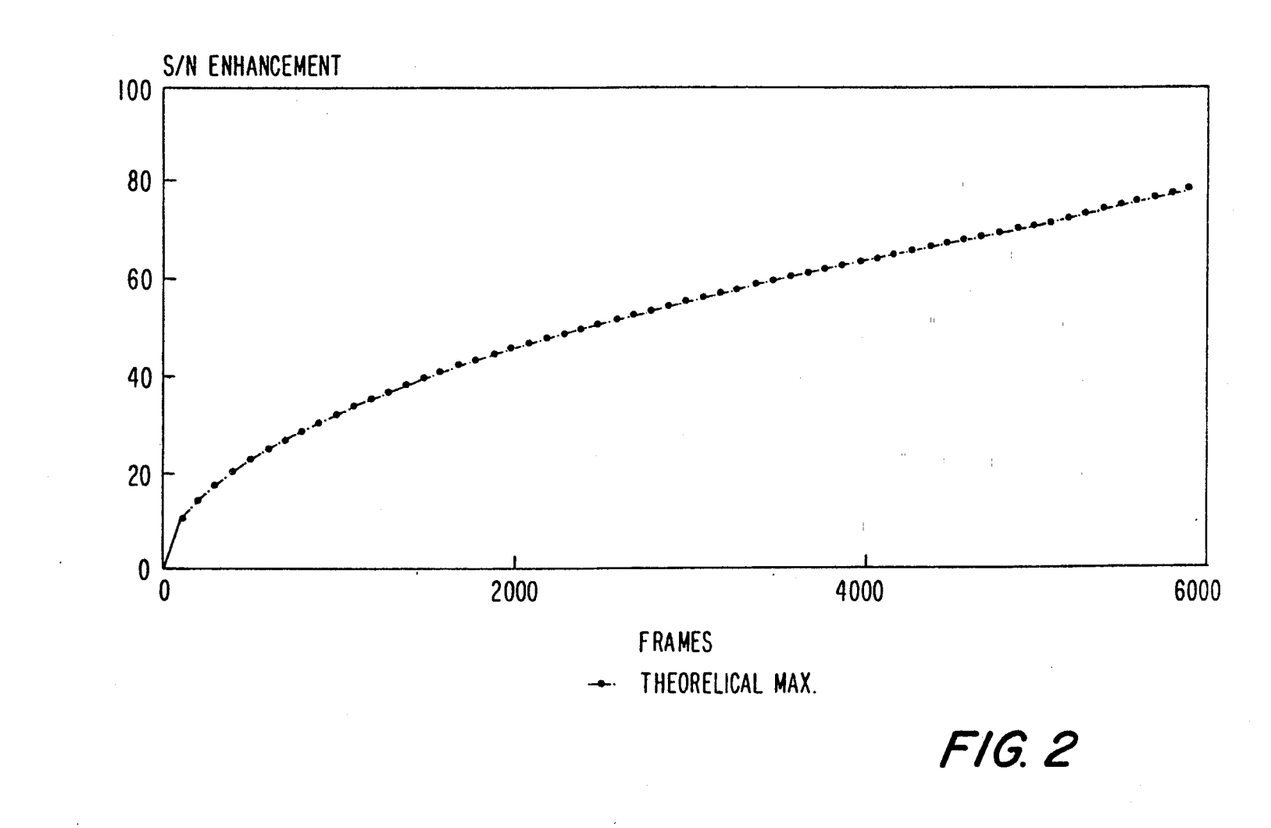
FIG. 2 is a chart plotting the theoretical maximum signal-to-noise ratio enhancement as a function of the video frame count of the temporal filter device shown in FIG. 1.
Figure 3A:
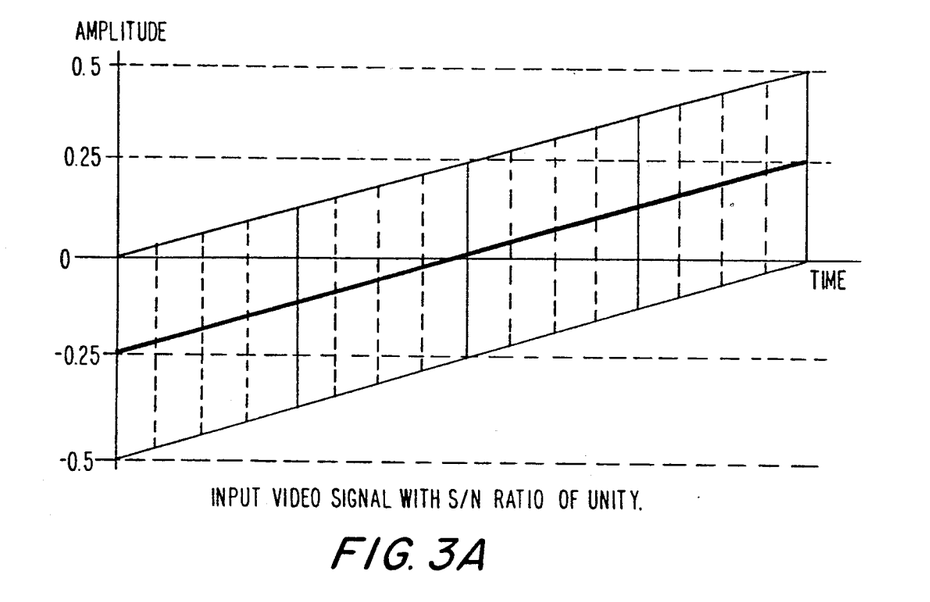
FIG. 3A is a chart plotting the amplitude of the input video signal as a function of time with a signal-to-noise ratio of unity for the temporal filter device shown in FIG. 1.
Figure 3B:
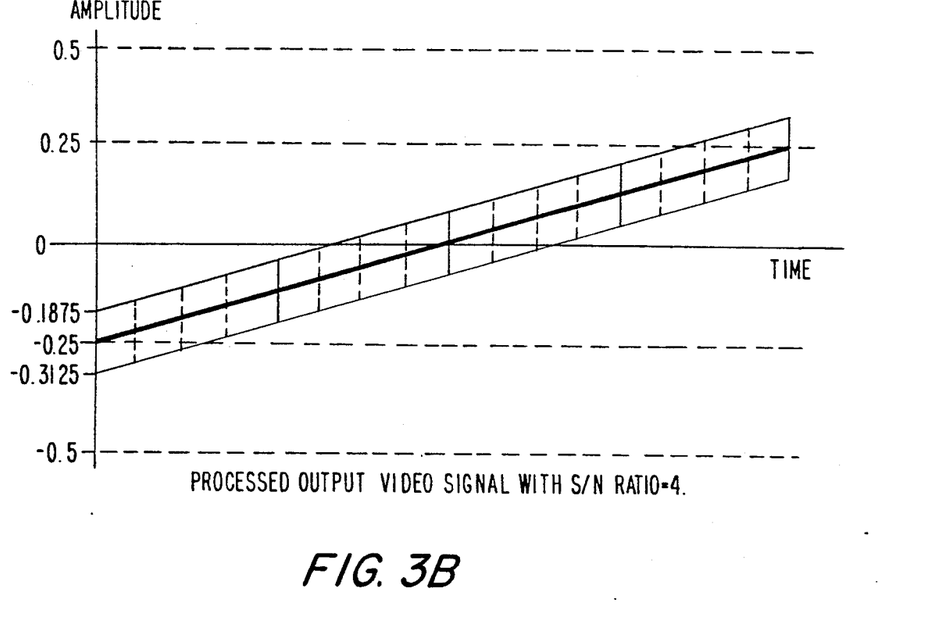
FIG. 3B is a chart plotting the amplitude of the output video signal as a function of time with a signal-to-noise ratio of four for the temporal filter device shown in FIG. 1.

As appreciated from the above equation expansion, the output signal $y_i$ is derived by averaging the input signals. During this "averaging" or processing, the standard deviation of the noise portion of the input signal is reduced as a function of the inverse square root of the frame count (i.e., $(1/i)^{\frac{1}{2}}$). This produces a theoretical maximum signal-to-noise ratio enhancement defined as:

$$S/N \text{ ratio Max. Enhancement} = \frac{S/N_{out}}{S/N_{in}} = i^{\frac{1}{2}} \quad (2)$$

in which $S/N_{out}$ is the signal-to-noise ratio of the processed output video signal and $S/N_{in}$ is the signal-to-noise ratio of the input video signal. A chart of the theoretical maximum signal-to-noise enhancement (in accordance with equation 2) as a function of frame count is illustrated in FIG. 2. An example of the filtering process is depicted in FIG. 3; that is, FIG. 3A shows the amplitude of an input video signal as a function of time with a signal-to-noise ratio of unity and FIG. 3B shows the amplitude of an output video signal as a function of time which has been processed through a temporal filter device for sixteen frames with a corresponding signal-to-noise ratio of four. The input and output video signals of FIGS. 3A and 3B are derived from Equation 2. From FIGS. 3A and 3B, it is to be appreciated that the amplitude of the processed signal component is identical to the amplitude of the input signal component whereas, the standard deviation of the noise level of the processed output signal is $\frac{1}{4}$ that of the standard deviation of the input signal. Therefore, while the amplitude of the processed noise level can be identical to that of the input signal, the statistical probability of this occurring is substantially reduced.

Processing through the temporal filter continues until the required output signal-to-noise ratio is obtained, whereupon the process is terminated. In comparison to filters prior to temporal, the output signal produced from the temporal apparatus (FIG. 1) possesses an improved signal-to-noise ratio, however, the video image contrast was considerably reduced. This loss in video image contrast will now be explained.

In the temporal apparatus, sufficient dynamic range is allocated for the input signal and its associated noise level to be digitized without permitting any portion of the input signal to be clipped, thereby avoiding distortions in the output video signal. The input digitized signals are processed, or "averaged", whereupon the noise components are reduced which results in an improved signal-to-noise ratio. Therefore, upon completion of processing, the noise portion is effectively eliminated whereas the signal component remains. The portion of the originally allocated dynamic range which is occupied by the signal component, or image contrast, is defined as the ratio of the output signal component amplitude to the input video signal amplitude (i.e., the signal component with its noise level) and can be expressed as:

$$\text{Contrast} = \frac{S/N_{in}}{(1 + S/N_{in})} \quad (3)$$

Figure 4:
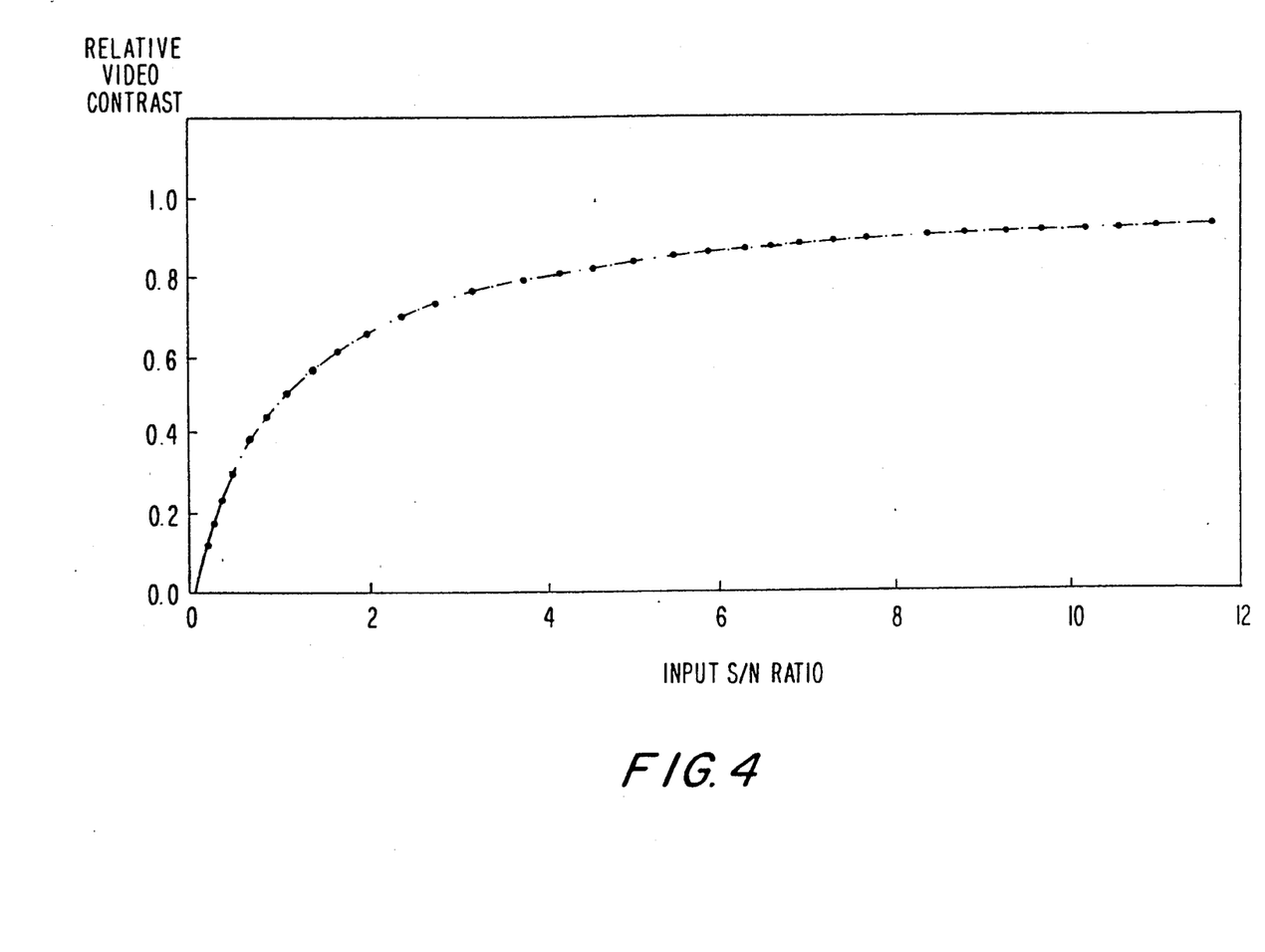
FIG. 4 is a chart plotting the loss of contrast as a function of the signal-to-noise ratio of the input signal of the temporal filter device shown in FIG. 1.

FIG. 4 illustrates the loss of contrast as a function of the signal-to-noise ratio of the input video signal in accordance with Equation 3. As illustrated in FIG. 4, for an input signal-to-noise ratio of unity there is a 50% reduction in video image contrast.

Figure 5:
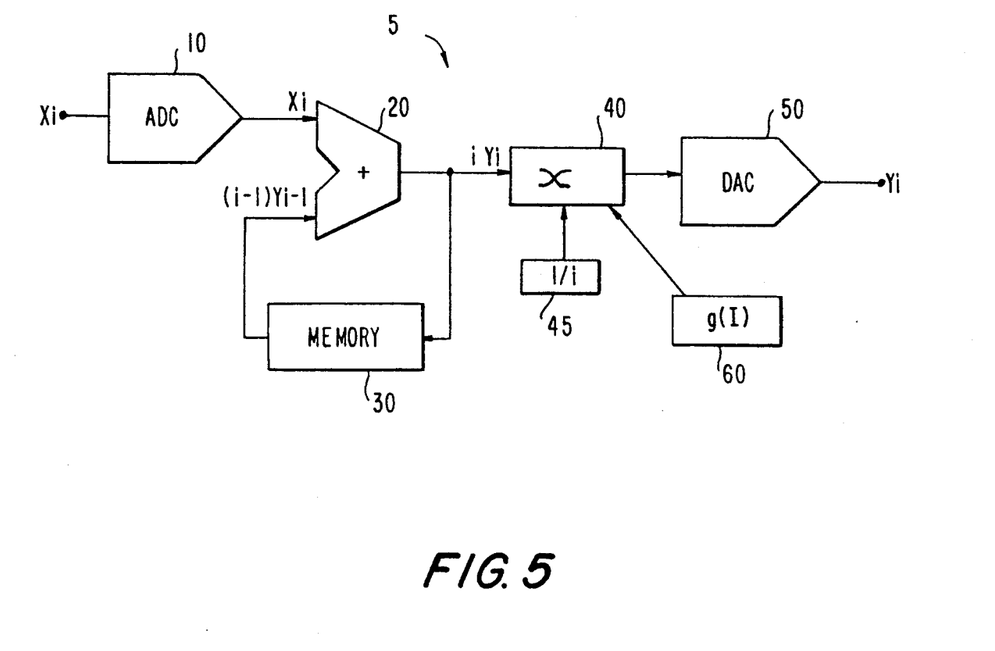
FIG. 5 is a block diagram illustrating an improved system for improving the signal-to-noise ratio of video display signals supplied to a video display unit according to an embodiment of the present invention.

An apparatus for improving the signal-to-noise ratio of video signals while minimizing the loss of image contrast according to an embodiment of the present invention will now be described with reference to FIG. 5. In FIG. 5, those elements presented in the prior art temporal filter device will be represented by the same reference numeral designations.

The apparatus shown in FIG. 5 is a Kalman filter which includes an analog-to-digital converter (ADC) 10, a calculating device 20, a memory device 30, a multiplying device 40, a determining device 45, a generating device 60 and a digital-to-analog converter (DAC) 50. ADC 10, calculating device 20, memory device 30, multiplying device 40, determining device 45 and DAC 50 function as described in FIG. 1. Generating device 60 is coupled to multiplying device 40 and is adapted to provide a gain factor signal, as a function of the frame count, which maintains preferably substantially full image contrast, and more preferably, full image contrast for each video signal frame. Processing of the input video signal through the apparatus in FIG. 5 proceeds in a similar manner to that described for FIG. 1 except for the addition of the gain factor signal from generating device 60. That is, during each processing step through the filter device, generating device 60 generates a gain signal, which is supplied to each frame of the video signal thereby maintaining full image contrast on a frame-by-frame basis. The mathematical relationship utilized in the improved temporal filter device shown in FIG. 5 is based upon the formula for the conventional temporal filter as defined in equation 1 and can be expressed as:

$$y_i = \frac{g(i) x_i}{i} + \frac{(i-1)g(i) y_{i-1}}{(i)g(i-1)} \qquad (4)$$

where $g(i)$ is the gain signal required to maintain full video contrast for frame $y_i$. It is to be appreciated that an expression for $g(i)$ as a function of known variables is required before the relationship expressed in equation 4 can be effectively utilized. The derivation for $g(i)$ as a function of known variables follows:

Upon adding i video signal frames together and dividing by i results in the signal component of the video signal being unchanged. That is, $$\text{Signal Component out} = \text{Signal Component in} \qquad (5)$$

Whereas as noted hereinbefore the noise component is reduced to:

$$\text{Noise Component out} = \frac{\text{Noise Component in}}{i^{\frac{1}{2}}} \qquad (6)$$

The amount of gain required to recover the reduction in the noise component is:

$$g(i) = \frac{S_{in} + N_{in}}{S_{in} + (N_{in}/i^{\frac{1}{2}})} = \frac{1}{[(i^{\frac{1}{2}}) (S_{in}) + N_{in}]/i^{\frac{1}{2}}}$$

$$g(i) = \frac{i^{\frac{1}{2}}}{(i^{\frac{1}{2}} \text{ Signal Component in} + \text{Noise Component in})} \qquad (7)$$

where the signal component in and the noise component in terms can be expressed as:

$$\text{Signal Component in} = \frac{S/N_{in}}{(1 + S/N_{in})}, \text{ and} \qquad (8)$$

$$\text{Noise Component in} = \frac{1}{(1 + S/N_{in})}. \qquad (9)$$

Substituting the relationships from equations 8 and 9 into equation 7 results in:

$$g(i) = \frac{i^{\frac{1}{2}}(1 + S/N_{in})}{[1 + i^{\frac{1}{2}}(S/N_{in})]} \qquad (10)$$

While equation 10 represents the gain required to maintain full video contrast in each video frame, the gain is expressed as a function of $S/N_{in}$ which is typically an unknown quantity and cannot be readily determined during digital processing through the filter apparatus shown in FIG. 5. Hence, the term $S/N_{in}$ must be replaced with a term(s) which is available during digital processing. From equation 2 the following relationship is derived:

$$S/N_{in} = \frac{S/N_{or}}{i_0^{\frac{1}{2}}} \qquad (11)$$

where $S/N_{or}$ is the required signal-to-noise ratio of the output video signal and $i_o$ represents the number of video frames which must be processed to reach the required output signal-to-noise ratio. Substituting equation 11 into equation 10 produces:

$$g(i) = \frac{i^{\frac{1}{2}}(i_0^{\frac{1}{2}} + S/N_{or})}{[i_0^{\frac{1}{2}} + i^{\frac{1}{2}}(S/N_{or})]} \qquad (12)$$

Figure 6:
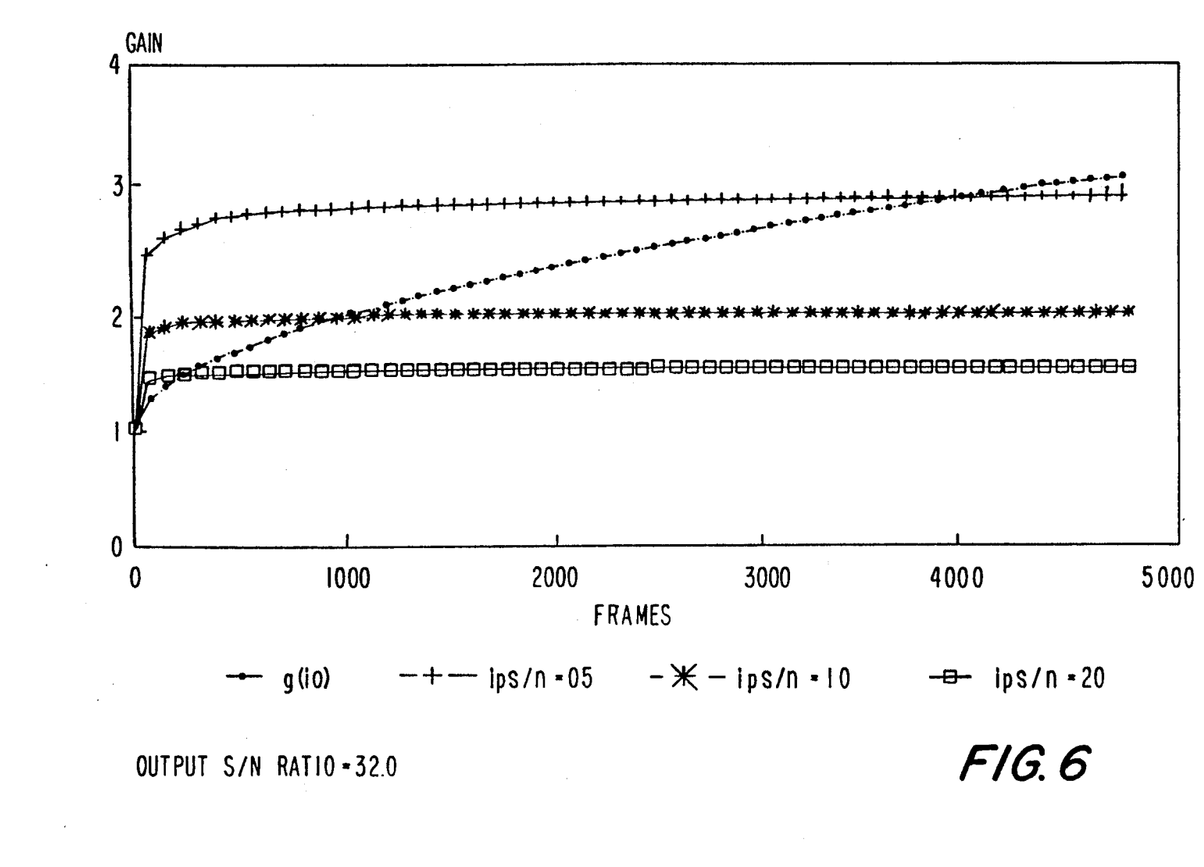
FIG. 6 is a chart plotting filter gain as a function of frame count which illustrates a comparison between the gain factor signals.

Since the digital processing is terminated when $i = i_o$ (i.e., when the frame count equals the frame count required to achieve the required output signal-to-noise ratio), equation 12 may be reduced for this case as follows:

$$g(i_0) = \frac{(i_0^{\frac{1}{2}} + S/N_{or})}{(1 + S/N_{or})} \qquad (13)$$

where $g(i_o)$ is the gain value at the termination frame. FIG. 6 illustrates the comparison between the gain values derived from equations 10 and 13. In FIG. 6, three curves are shown for gains derived from equation 10 (i.e., for $S/N_{in} = 0.5$, 1.0 and 2.0), and a value of $S/N_{or} = 32$ is used to derive the gain values from equation 13. The intersections between the $g(i_o)$ and the $g(i)$ curves represent the filter termination points, wherein both a full contrast output image and an output signal-to-noise ratio of $S/N_{or} = 32$ exist simultaneously, for the specified input signal-to-noise ratios. The only minor discrepancy in using the $g(i_o)$ gain values occurs with input signal-to-noise ratios less then 2.0, wherein it is observed that the output image contrast reaches full contrast at the filter termination point rather than maintaining full image contrast after every frame is processed. However, for input signal-to-noise ratios greater than two, the $g(i_o)$ and the $g(i)$ curves are almost identical, thereby minimizing this effect. It is to be appreciated that equation 13 expresses the signal gain in terms of the required signal-to-noise ratio of the output video signal which is more readily determinable than the input signal-to-noise ratio as expressed in equation 10. Substituting the gain signal relationship from equation 13 into equation 4 for the condition $i = i_o$ yields the mathematical recursive filter relationship which is used in the filter apparatus shown in FIG. 5. This relationship is expressed as:

$$y_i = \frac{(i^{\frac{1}{2}} + S/N_{or}) x_i}{i(1 + S/N_{or})} + \frac{(i-1) (i^{\frac{1}{2}} + S/N_{or}) y_{i-1}}{i[(i-1)^{\frac{1}{2}} + S/N_{or}]} \qquad (14)$$

Equation 14 expresses the current output video signal frame as a function of variables which are more readily available during processing, that is, the frame count and the required output signal-to-noise ratio.

Therefore, in accordance with this embodiment, filter processing, utilizing the above mathematical relationship expressed in equation 14, continues until a desired output signal-to-noise ratio is obtained at which time the filter is terminated manually or automatically. Manual termination can be effected by an operator upon satisfactory visual inspection of the output signal, which is normally visible during processing. Typical processing times are 20-100 sec, although the signal-to-noise ratio may continue to improve for up to 10 minutes of processing. As an alternative, the filter could be terminated manually or automatically upon completion of processing a specified number of frames. If filter processing is allowed to continue, that is, if filter processing is not properly terminated as previously described, excess image contrast will result thereby causing a loss of signal information in pure white and pure black areas.

Figure 7:
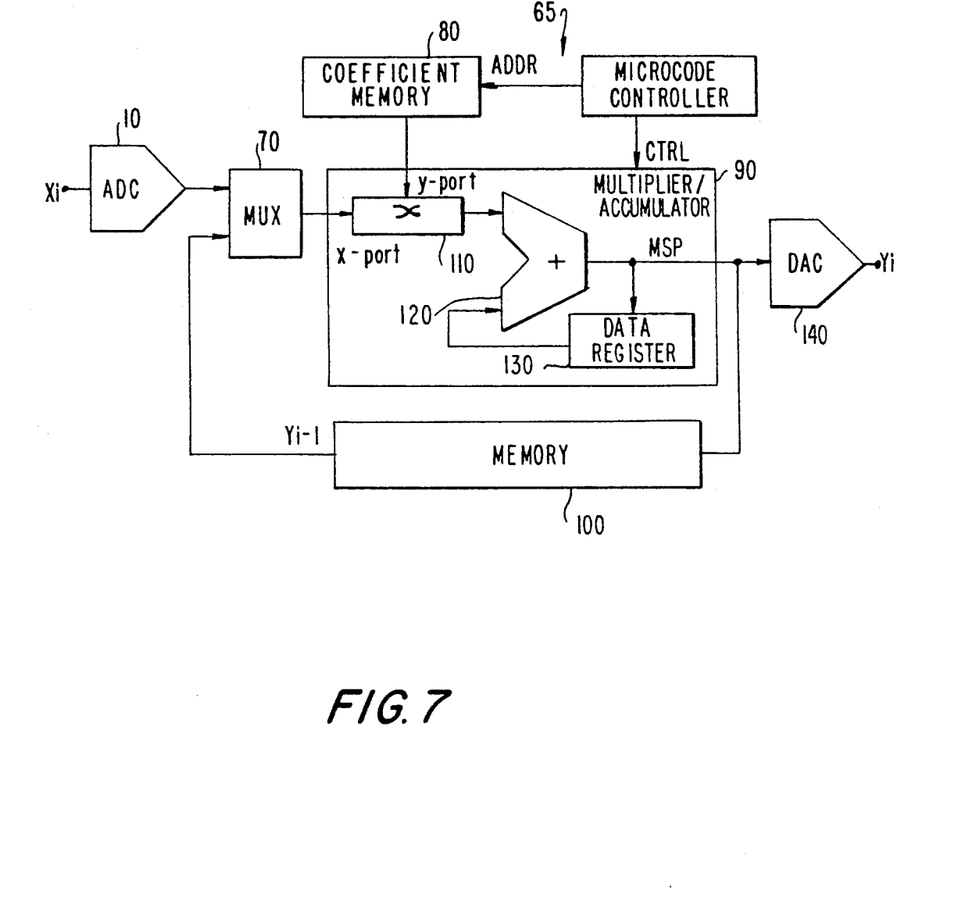
FIG. 7 is a block diagram illustrating an improved system for improving the signal-to-noise ratio of video display signals supplied to a video display unit according to another embodiment of the present invention.

A second preferred embodiment of a Kalman filter 65 in accordance with the present invention is illustrated in FIG. 7 and includes an analog-to-digital convertor (ADC) 10, a multiplexer device 70, a coefficient memory 80, a multiplier/accumulator device 90, a memory 100 and a digital-to-analog (DAC) converter 110. Input video signals are supplied through an input terminal $x_i$ to ADC 10 wherein they are digitized and supplied to multiplexer device 70 along with a second input from memory 100. Multiplexer device 70 is adapted to selectively choose one of the input signals and to supply the same to multiplier/accumulator device 90. Coefficient memory 80 is adapted to supply respective coefficients to multiplier/accumulator device 90 which includes a multiplying device 110, an adding device 120 and a data register 130. Multiplier/accumulator 90 is adapted to receive the selected input signal from multiplexer device 70 and the respective coefficient from coefficient memory 80 and to multiply both input signals together and store the product in data register 130. Multiplier/accumulator 90 is further adapted to receive the other input signal from multiplexer device 70 and its respective coefficient from coefficient memory 80, to multiply the two signals together and to add the product to the product formerly stored in data register 130. The sum of the two products is outputted from multiplier/accumulator 90 to DAC 140 wherein the digitized processed video signal is converted to analog form and supplied to an output terminal. The output signal from multiplier/accumulator 90 is also supplied to memory 100 which is adapted to store this output signal and to supply the same as a output signal from a preceding frame to multiplexer 70.

The operation of the apparatus described above for the second embodiment of the present invention follows:

The filter apparatus shown in FIG. 7 performs processing in accordance with equation 14 (in a preferred embodiment, the apparatus performs a 12-bit fixed-point accuracy processing of equation 14). That is, a current frame of a video signal, $x_i$ is supplied to ADC 10, which in a preferred embodiment is an 8 bit ADC, wherein the video signal is digitized and supplied to multiplexer 70. A second input, $y_{i-1}$, representing the preceding output signal, is supplied to multiplexer 70 from memory 100.

Memory 100, in a preferred embodiment, is a $512 \times 512$ array of RAM locations which holds the current video pixel values as a function of their X-Y coordinates in the image. Memory 100 is addressed sequentially in a raster pattern as the beam scans across the specimen wherein new video values immediately replace old values as the data is processed. Since the input raster may have more than 512 lines, multiple beam passes are sometimes mapped into the same line in the memory. Multiple video samples per pixel time can also be utilized at slower scan speeds.

Multiplexer 70 is controlled to supply one signal at a time to connect multiplier/accumulator 90 which in a preferred embodiment is a standard 12-bit multiplier/accumulator. Initially, the current input video signal, $x_i$, is supplied to multiplying device 110, from multiplexer 70, wherein it is multiplied by a coefficient, supplied from coefficient memory 80 which represents the combination of the normalization signal and the gain signal.

Coefficient memory 80 is indexed or stepped through sequentially, with ascending sample count for a given pixel wherein separate counters keep track of the total frame, line and video A/D conversion periods a pixel has accumulated since the previous beginning of a filter cycle. The sample count is a running sum of all video samples that have occurred within the pixel area. Each pixel is processed independently after every video sample according to the previously described mathematical relationship as a function of $y_{i-1}$, the previously stored value; $x_i$, the latest sample value; and the sample count i.

The product signal, from multiplying device 110, is stored in data register 130. In a similar matter, the preceding output signal $y_{i-1}$, obtained from memory 100, is supplied to multiplying device 110 wherein it is multiplied by a coefficient representing the combination of its associated normalization signal and gain signal. The coefficient values corresponding to signals $x_i$ and $y_{i-1}$ are typically pre-calculated from the required output signal-to-noise ratio and the relationships defined in equation 14 and stored in coefficient memory 80. The accumulator portion of the multiplier/accumulator 90 adds the two products together, thereby forming an output video signal with an improved signal-to-noise ratio and improved image contrast. Computation times for the mathematical operations performed within multiplier/accumulator 90 are less than the period between the input video signal frames (typically less than 100 ns). In the preferred embodiment, the most significant 12 bits (from the 24-bit sum of the products) of the processed output video signal are rounded to the nearest 12-bit integer which thereby prevents truncation errors. The output video signal is converted to analog form by DAC 140 and supplied to an output terminal. The output signal from multiplier/accumulator 90 is also supplied to memory 100.

While the filter apparatus described in the above embodiments of the present invention can theoretically operate through any range of signal-to-noise ratios, there may be practical limitations on the signal-to-noise ratio enhancement. Factors which could influence the signal-to-noise ratio enhancement include the: minimum signal-to-noise ratio required to locate and focus an image; input analog/digital resolution, which in a preferred embodiment is 8 bits; amount of image memory storage bits, which in a preferred embodiment is 12 bits; computation precision, which in a preferred embodiment is 12 bits; input signal bandwidth and the amount of time the image source remains "stationary".

Although preferred embodiments of the present invention have been described in detail, it is to be understood that this invention is not limited to those precise embodiments. Furthermore, the present invention is not limited to display signals received from an SEM, but can be utilized in any application which exhibits a signal-to-noise enhancement problem having the same characteristics as the SEM signal, that is, a low signal-to-noise ratio and a relatively stationary signal embedded in random noise. Other possible applications include medical diagnostic imaging and low-light level imaging applications such as astronomy or surveillance. Moreover, many modifications and variations may be effective by one skilled in the art without departing from the spirit and scope of the invention as defined by the appending claims. It is intended that the appended claims be interpreted as including the foregoing as well as various other such changes and modifications.

What is claimed is:

1. Apparatus for improving the signal-to-noise ratio of video display signals while minimizing the loss of image contrast, said apparatus comprising:
   input means for receiving frames of said video display signals;
   calculating means coupled to said input means for producing a sum signal representing the sum of a present frame of video display signals and an output video display signal of a preceding frame;
   generating means for generating a gain factor signal, wherein said generating means generates said gain factor signal according to the following formula:

$$g = (i^1 + S/N_{or})/(1 + S/N_{or})$$

wherein, g is said gain factor signal, i is a frame count and $S/N_{or}$ is a predetermined signal-to-noise ratio of said output video display signal;
   determining means for determining a normalization factor signal of said sum signal;
   video display means;
   multiplying means coupled to said calculating means, said generating means and said determining means for multiplying said sum signal, said gain factor signal and said normalization factor signal to produce an output video display signal with improved signal-to-noise ratio and minimum loss of image contrast for supply to said video display means; and
   wherein said input means, said calculating means, said determining means and said multiplying means are comprised within a Kalman filter.

2. Apparatus for improving the signal-to-noise ratio of video display signals while minimizing the loss of image contrast, said apparatus comprising:
   input means for receiving frames of said video display signals;
   calculating means coupled to said input means for producing sum signal representing the sum of a present frame of video display signals and an output video display signal of a preceding frame;
   generating means for generating a gain factor signal
   determining means for determining a normalization factor signal of said sum signal;
   video display means;
   multiplying means coupled to said calculating means, said generating means and said determining means for multiplying said sum signal, said gain factor signal and said normalization factor signal to produce an output video display signal with improved signal-to-noise ratio and minimum loss of image contrast for supply to said video display means, wherein said multiplying means multiplies said sum signal, said gain factor signal and said normalization factor signal according to the following formula:

$$y = \frac{(i^1 + S/N_{or}) X_i}{i(1 + S/N_{or})} + \frac{(i - 1)(i^1 + S/N_{or}) y_{i-1}}{i[(i - 1)^1 + S/N_{or}]}$$

wherein y is a present output video display signal, $y_{i-1}$ is a preceding output video display signal, $x_i$ is a present input signal supplied to said input means, i is a frame count and $S/N_{or}$ is a predetermined signal-to-noise ratio of said output video display signal; and
   wherein said input means, said calculating means, said determining means and said multiplying means are comprised within a Kalman filter.

3. Apparatus for improving the signal-to-noise ratio of video display signals while minimizing the loss of image contrast, said apparatus comprising:
   generating means for generating a gain factor signal;
   filter means for receiving said video display signals and applying said gain factor signal received from said generating means to said video display signals, thereby improving the signal-to-noise ratio of said supplied video display signal with minimal loss of image contrast, wherein said filter means includes calculating means for receiving and summing a present video display signal and a preceding supplied video display signal to form a sum signal, and wherein said generating means generates said gain factor signal according to the following formula:

$$g = (i^1 + S/N_{or})/(1 + S/N_{or})$$

wherein, g is said gain factor signal, i is a frame count and $S/N_{or}$ is a predetermined signal-to-noise ratio of said output video display signal;
   video display means;
   multiplying means for multiplying said sum signal by said gain factor signal to produce said video display means for supply to said video display means; and
   wherein said filter means and said multiplying means comprised within a Kalman filter.

4. Apparatus for improving the signal-to-noise ratio of video display signals while minimizing the loss of image contrast, said apparatus comprising:
   input means for receiving frames of said video display signal;
   multiplier accumulator means coupled to said input means;
   first memory means coupled to said multiplier accumulator means for storing respective signals representing coefficients;
   second memory means adapted to receive an output video display signal from said multiplier accumulator means;
   video display means;
   said multiplier accumulator means being operative to multiply a respective coefficient signal recalled from said first memory means with a frame of an input video display signal supplied from said input means forming a first product, said multiplier accumulator means being further operative to multiply another respective coefficient recalled from said first memory means with a previous frame of said output video display signal supplied from said second memory means forming a second product, and said multiplier accumulator means being additionally operative to add said first product and said second product together thereby forming an output video display signal with improved signal-tonoise ratio and minimal loss of image contrast for supply to said video supply means;

said multiplier accumulator means further including a multiplexer means coupled to said receiving means and said second memory means, said multiplexer means selectively operable for supplying one of said input video display signal or said previous output video display signal; and wherein said input means, said multiplier accumulator means, and said second memory means comprise a Kalman filter.

5. Apparatus for improving the signal-to-noise ratio of video signals while minimizing the loss of image contrast, said apparatus comprising:

input means for receiving frames of said video display signal;

multiplier accumulator means coupled to said input means;

first memory means coupled to said multiplier accumulator means for storing respective signals representing coefficients;

second memory means adapted to receive an output video display signal from said multiplier accumulator means;

video display means;

said multiplier accumulator means being operative to multiply a respective coefficient signal recalled from said first memory means with a frame of an input video signal supplied from said input means forming a first product, said multiplier accumulator means being further operative to multiply another respective coefficient recalled from said first memory means with a previous frame of said output video display signal supplied from said second memory means forming a second product and said multiplier accumulator means being additionally operative to add said first product and said second product together thereby forming an output video display signal with improved signal-to-noise ratio and minimal loss of image contrast for supply to said video display means, wherein said coefficient for said input video display signal is determined according to the following formula:

$$\text{Coefficient} = \frac{(i^{\frac{1}{2}} + S/N_{or})}{i(1 + S/N_{or})}$$

wherein, i is the frame count and $S/N_{or}$ is a predetermined output signal-to-noise ratio of said output video display signal; and wherein said coefficient for said previous output video display signal is determined according to the following formula:

$$\text{Coefficient} = \frac{(i-1)(i^{\frac{1}{2}} + S/N_{or})}{i[(i-1)^{\frac{1}{2}} + S/N_{or}]} ;$$

and wherein said input means, said multiplier accumulator means, and said second memory means are comprised within a Kalman filter.

6. A method of improving the signal-to-noise ratio of video display signals supplied to a video display unit while minimizing the loss of image contrast, said method comprising the steps of:

generating a gain factor signal; and combining said video display signals and said gain factor signal in temporal filter means, thereby improving the signal-to-noise ratio of said supplied video display signal with minimal loss of image contrast, said temporal filter means including a Kalman filter and said gain factor is generated according to the following formula:

$$g = (i^{\frac{1}{2}} + S/N_{or})/(1 + S/N_{or})$$

wherein, g is said gain factor signal, i is a frame count and $S/N_{or}$ is a predetermined signal-to-noise ratio of said output video display signal.

* * * * *